(12) United States Patent
Sadygov et al.

(10) Patent No.: US 9,917,118 B2
(45) Date of Patent: Mar. 13, 2018

(54) PHOTODETECTOR ARRAY AND METHOD OF MANUFACTURE

(75) Inventors: Ziraddin Yagub-Ogly Sadygov, Dubna (RU); Abdelmounaime Faouzi Zerrouk, Lausanne (CH); Azar Sadygov, Baku (AZ); Azman Mohd Ariffin, Singapore (SG); Serge Khorev, Richmond (CA)

(73) Assignee: ZECOTEK IMAGING SYSTEMS PTE. LTD., Singapore (SG)

( * ) Notice: Subject to any disclaimer, the term of this patent is extended or adjusted under 35 U.S.C. 154(b) by 0 days.

(21) Appl. No.: 13/609,136

(22) Filed: Sep. 10, 2012

(65) Prior Publication Data

US 2014/0183684 A1 Jul. 3, 2014

Related U.S. Application Data (60) Provisional application No. 61/532,904, filed on Sep. 9, 2011.

(51) Int. Cl.
*H01L 27/144* (2006.01)
*H01L 31/107* (2006.01)

(52) U.S. Cl.
CPC ........ *H01L 27/1446* (2013.01); *H01L 31/107* (2013.01)

(58) Field of Classification Search
CPC ............. H01L 31/107; H01L 31/02027; H01L 2924/12043; H01L 27/14643–27/14663; G01T 1/248
See application file for complete search history.

(56) References Cited

U.S. PATENT DOCUMENTS

| | | |
|---|---|---|
| 6,853,046 B2 | 2/2005 | Shibayama |
| 7,714,292 B2 | 5/2010 | Agarwal et al. |
| 2004/0104351 A1* | 6/2004 | Shibayama ......... H01L 27/1446 250/370.11 |

(Continued)

OTHER PUBLICATIONS

Dinu et al., "Characteristics of a prototype matrix of Silicon PhotoMultipliers (SiPM)," Journal of Instrumentation 4 (P03016):1-9, Mar. 18, 2009, first disclosed Sep. 23-26, 2008.

*Primary Examiner* — Marc Armand
*Assistant Examiner* — Quinton Brasfield
(74) *Attorney, Agent, or Firm* — Davis Wright Tremaine LLP (57) ABSTRACT

The present invention is directed to photodiode arrays comprising a dielectric structure containing an array of face conductive areas (pads) and. Each photodiode is fully separated from each other. Every photodiode has a face electrode formed on sensitive side of the semiconductor substrate and an individual back electrode formed on the opposite side. The number of conductive areas on the dielectric structure is equal to number of photodiodes in the array. The photodiodes of the array are installed on the conductive areas so that their back electrodes have electrical contact with the corresponding conductive area. Each conductive area contains at least one individual conductive hole penetrating the dielectric package from the face side to the opposite side of the dielectric structure. The conductive holes going to backside of the dielectric structure are connected with the back conductive areas formed on back side of dielectric package.

16 Claims, 6 Drawing Sheets

(56) References Cited

U.S. PATENT DOCUMENTS

| | | | | |
|---|---|---|---|---|
| 2005/0030403 A1* | 2/2005 | Yaung | ............... | H01L 27/14603 257/E27.131 |
| 2006/0145084 A1* | 7/2006 | Mori | ................... | H01L 27/1463 257/E31.053 |
| 2007/0075408 A1* | 4/2007 | Shibayama | .......... | H05K 3/3436 257/678 |
| 2007/0284714 A1* | 12/2007 | Sakakibara | ........... | H01L 23/055 257/680 |
| 2008/0099871 A1* | 5/2008 | Bui | .................... | H01L 27/1443 257/461 |
| 2009/0101909 A1* | 4/2009 | Chen | ................... | H01L 31/1808 257/65 |
| 2009/0256223 A1* | 10/2009 | Yamamura | .......... | H01L 27/1446 257/432 |
| 2010/0200940 A1* | 8/2010 | Ji | ..................... | H01L 27/14634 257/431 |
| 2011/0272561 A1* | 11/2011 | Sanfilippo | ........... | H01L 27/1446 250/214.1 |

* cited by examiner

PHOTODETECTOR ARRAY AND METHOD OF MANUFACTURE

CROSS-REFERENCE TO RELATED APPLICATIONS

This application claims the benefit of priority to U.S. Provisional Application No. 61/532,904 filed on Sep. 9, 2011, all of which application is incorporated herein by reference in its entirety for all purposes.

TECHNICAL FIELD

The present invention relates to semiconductor devices and, more specifically, to semiconductor photodetector arrays including avalanche photodiodes arrays and related methods of manufacture. The present invention may be used in position-sensitive detectors of weak light signals, gamma rays, and nuclear particles.

BACKGROUND OF THE INVENTION

Photodiode arrays are designed specifically for registration of fast optical signals with typical duration time from several picoseconds to a microsecond. Such photodiode arrays usually have one common electrode for a common working voltage supply to every element of the array. In addition, each element of the array typically includes another independent electrode to read out its individual electric signal. This configuration provides very fast readout of the signal from all of the photodiodes of the array.

Presently, photodiode arrays are widely used in research equipment and in consumer electronics as position-sensitive light detectors. However, a number of applications, such as Cherenkov detectors, medical tomography and others require relatively large photodiode arrays, with minimised dead (insensitive) space both between elements (photodiodes) of the array and along the array perimeter. A problem associated with the manufacturing of photodiode arrays is that as the number of elements increases, it becomes increasingly difficult to have a contact from the elements in the centre of the array. Traditionally, this problem is solved by tracing several conductive strips between the sensitive areas, but this leads to reduction of the sensitive area of the photodiode array.

One of the approaches known in the art (disclosed in U.S. Pat. No. 7,714,292 incorporated herein by reference) is based on an epitaxial semiconductor layer grown on top of a dielectric substrate. Contacts of the array elements are routed to the back surface of the epitaxial layer (that is to the boundary between the substrate and the epitaxial layer), and then taken along this boundary to the perimeter of the array. Deep doping of the back side of the epitaxial layer is used for electric insulation of the photo elements from each other. This approach requires an extremely complicated technology of epitaxial layer transfer from one substrate to another. Accordingly, the main drawback of this approach is its high cost as a consequence of very complicated fabrication technology.

Another technology known in the art (disclosed in U.S. Pat. No. 6,853,046 incorporated herein by reference) comprises a semiconductor substrate formed with an array of photodiodes on the light incident surface side. Here, the semiconductor substrate is used as common electrode for the array. A through hole penetrating through the semiconductor substrate from the light incident side to the opposite surface side is formed in an area held between photodiodes of the array. An individual conductive layer extending from every photodiode on the light incident side to the opposite surface side by way of a wall surface of the through hole is formed perpendicular to the light incident side. The conductive layer going to backside of the semiconductor substrate are used as individual electrodes the array photodiodes. The need for an insulated through hole between the sensitive elements leads to an increased dead space between them, constituting one of demerits of this approach.

Another photodiode array is known in the art (disclosed in N. Dinu et al. Characteristics of a prototype matrix of Silicon PhotoMultipliers (SiPM)—JINST, 4, P03016, (2009) incorporated herein by reference). In this approach, photodiodes of the arrayed photo-detector are disposed on a common semiconductor substrate, which also acts as the common electrode of the array. The individual electrodes of each photodiode are routed out to the perimeter of the array along the surface of the semiconductor substrate. In order to do that, special conductive strips insulated from both the substrate and photodiodes of the array are formed on the face side of the semiconductor substrate. One end of the conductive stripe is connected to a photodiode of the array and the other one to a metal pin located at the perimeter of the array. The conducting strips are disposed between the photodiodes, thereby leading to reduction of the active surface of the photodiode array. As the number of photodiodes in the array increases, the gap between them has to widen as well to accommodate a larger number of conductive strips. This leads to a dramatic increase of dead space of the photodiodes array, being a fundamental drawback of the said device.

Although some progress has made with respect to the development and manufacture of semiconductor photodetector arrays including avalanche photodiodes arrays, there is still a need in the art for new and different types of photodetector arrays. The present invention fulfills these needs and provides for further related advantages.

SUMMARY OF THE INVENTION

The present invention provides advancements and overcomes many of the above-mentioned problems and other limitations associated with the prior art by providing new designs and methods for making low cost and compact photodiode arrays having minimal dead space.

The photodiode array comprises a dielectric structure containing an array of face conductive areas (pads) and photodiodes fabricated on surface of a semiconductor substrate. Semiconductor substrate of photodiodes are fully separated from each other. Every photodiode has a face electrode formed on sensitive side of the semiconductor substrate and an individual back electrode formed on opposite side the semiconductor substrate. Number of conductive areas on the dielectric structure is equal to number of photodiodes in the array. Photodiodes of the array are installed on the conductive areas so that their back electrodes have electrical contact with the corresponding conductive area. Each conductive area contains at least one individual conductive hole penetrating the dielectric structure from the face side to the opposite side of the dielectric structure. The conductive holes going to backside of the dielectric structure are connected with back conductive areas formed on back side of dielectric structure.

All face electrodes of the photodiodes have electric contact with conductive strips formed on face side of the dielectric structure. The conductive strips contain at least one conductive hole penetrating the dielectric structure from the face side to the opposite side of the dielectric structure.

The conductive holes going to backside of the dielectric package are connected with back conductive areas formed on back side of dielectric structure. In this configuration, lower cost and more compact arrays with any number of photodiode elements can be designed and fabricated.

These and other aspects of the present invention will become more evident upon reference to the following detailed description and attached drawings. It is to be understood, however, that various changes, alterations, and substitutions may be made to the specific embodiments disclosed herein without departing from their essential spirit and scope. In addition, it is expressly provided that all of the various references cited herein are incorporated herein by reference in their entireties for all purposes.

BRIEF DESCRIPTION OF THE DRAWINGS

The drawings are intended to complement the summary given above and the detailed description that follows for better understanding of the invention. In the drawings like reference numerals are used to designate like features throughout the several views of the drawings.

Additional aspects, features, and advantages of the invention will be understood and will become more readily apparent when the present invention is considered in view of the following detailed description and accompanying drawings.

DETAILED DESCRIPTION OF THE INVENTION

Figure 1:
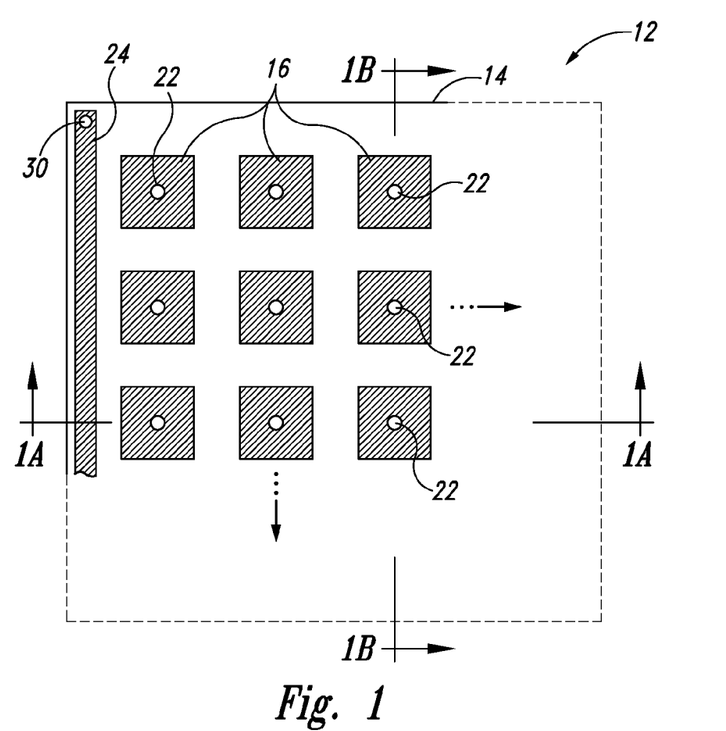
FIG. 1 shows a top view of a face or front side of a dielectric structure in accordance with an embodiment of the present invention.
Figure 1A:
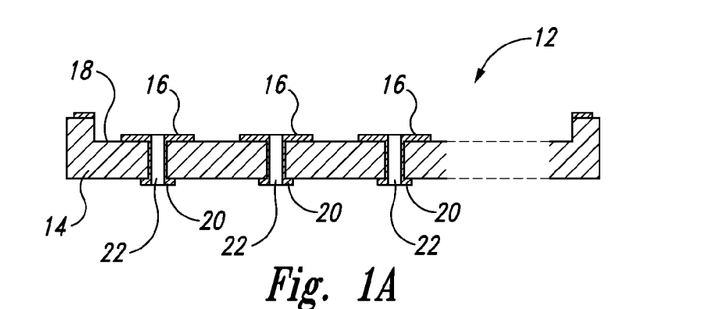
FIG. 1A shows a cross-sectional view taken along line A-A' of FIG. 1.
Figure 1B:
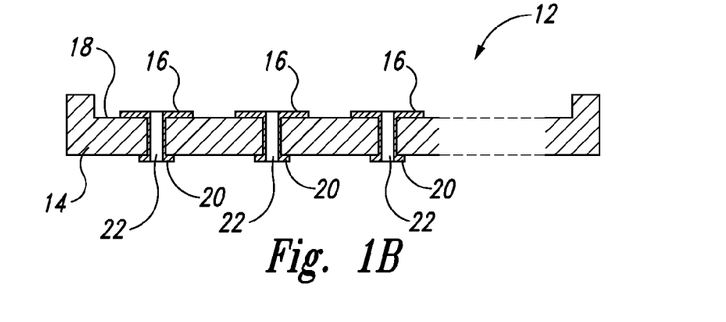
FIG. 1B shows a cross-sectional view taken along line B-B' of FIG. 1.
Figure 2:
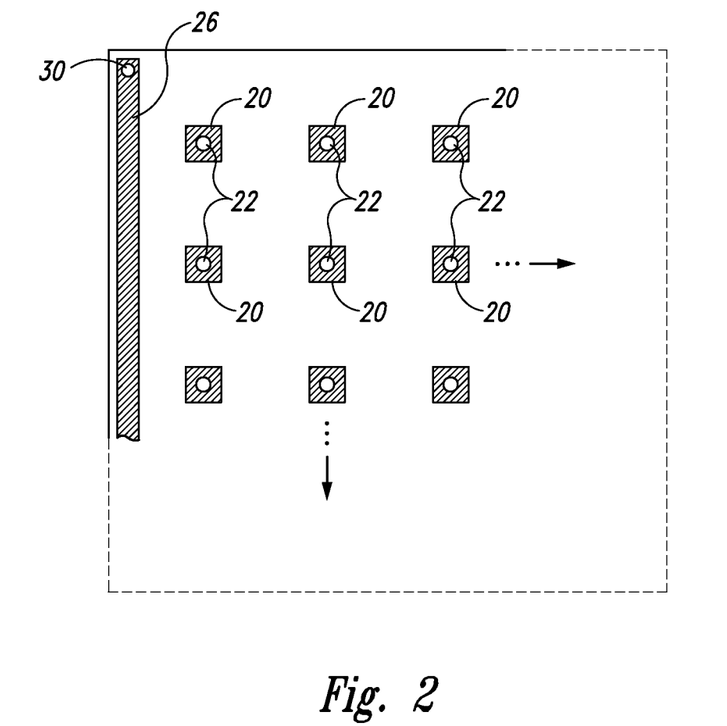
FIG. 2 shows a bottom view of a back side of the dielectric structure of FIG. 1.
Figure 3:
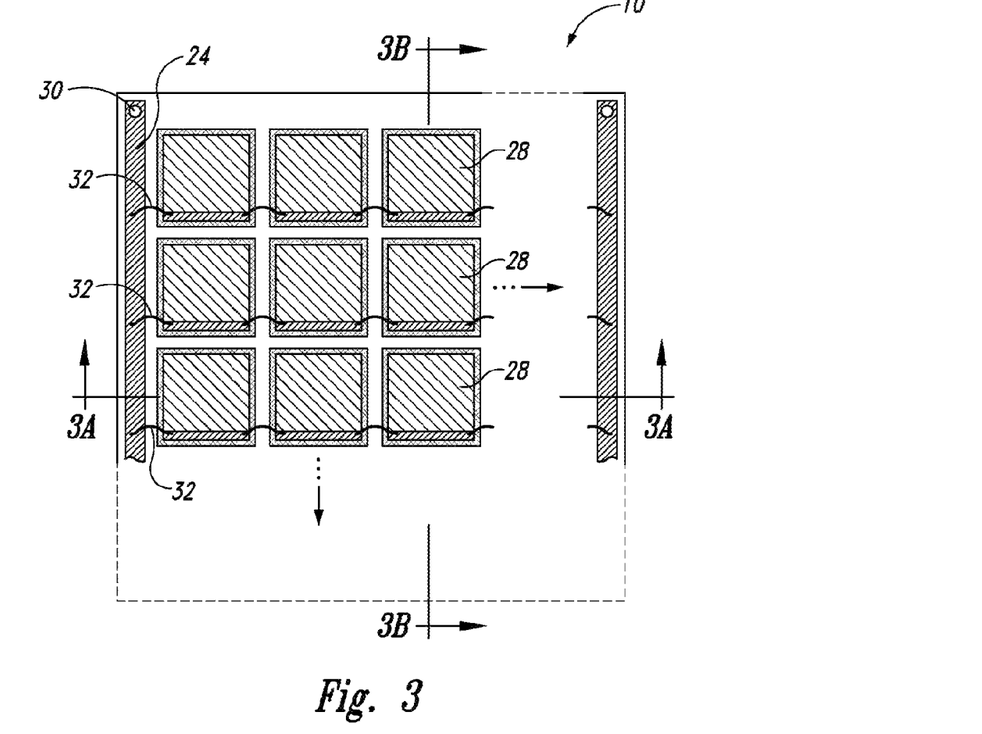
FIG. 3 shows a top view of a photodiode array assembled on front side of the dielectric structure in accordance with an embodiment of the present invention.
Figure 3A:
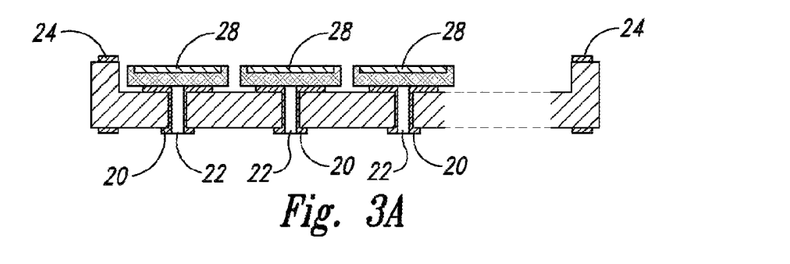
Figure 3B:
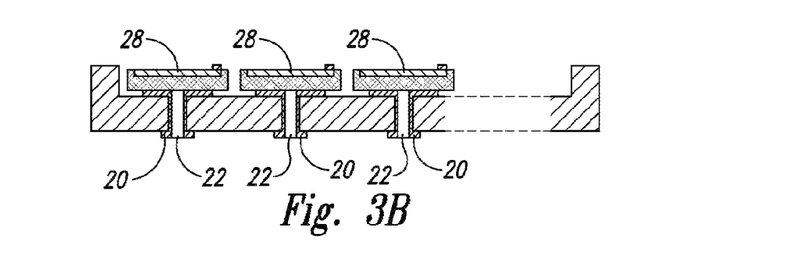
Figure 4A:
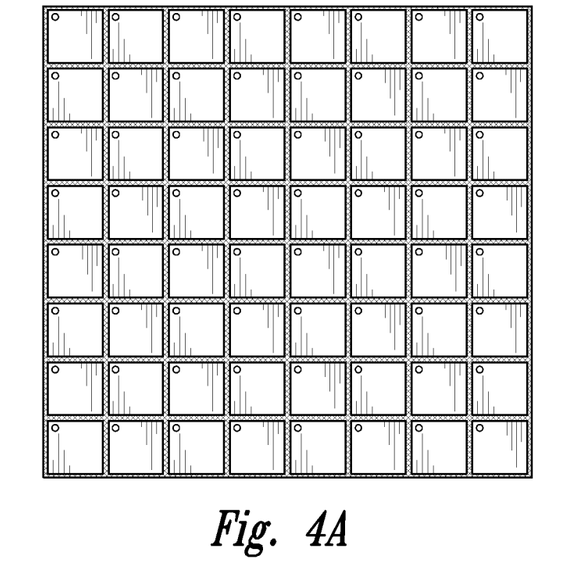
FIGS. 4A-F illustrate various intermediate structures associated with various embodiments of the present invention.
Figure 4B:
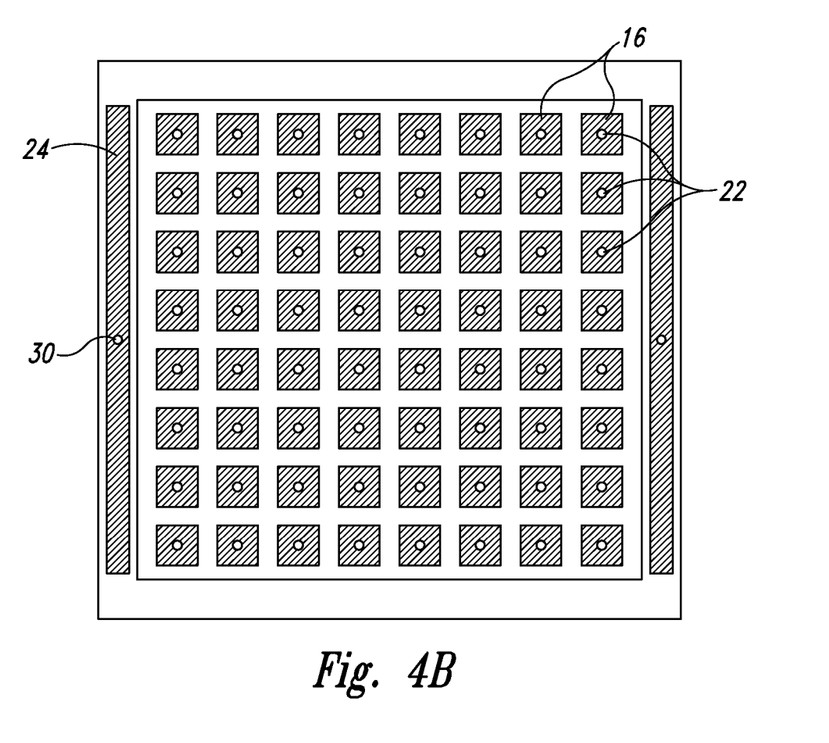
Figure 4C:
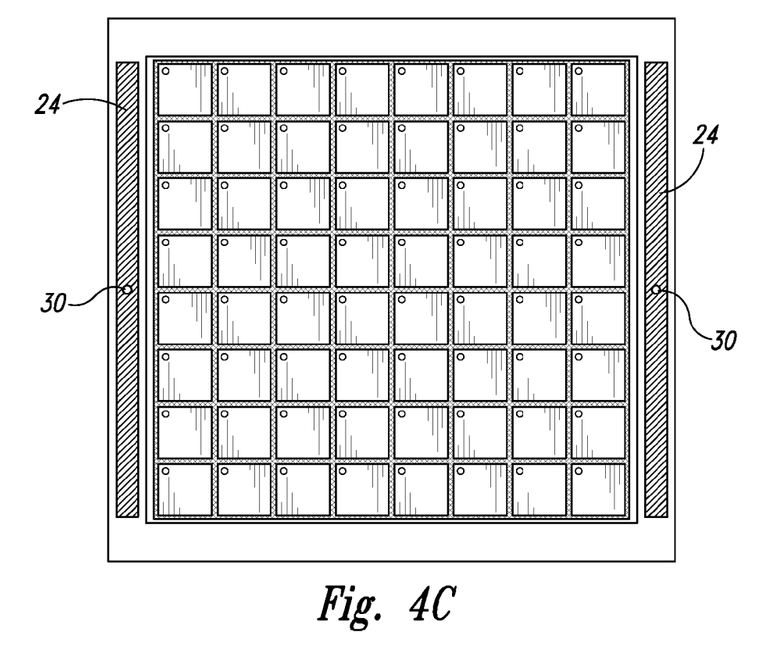
Figure 4D:
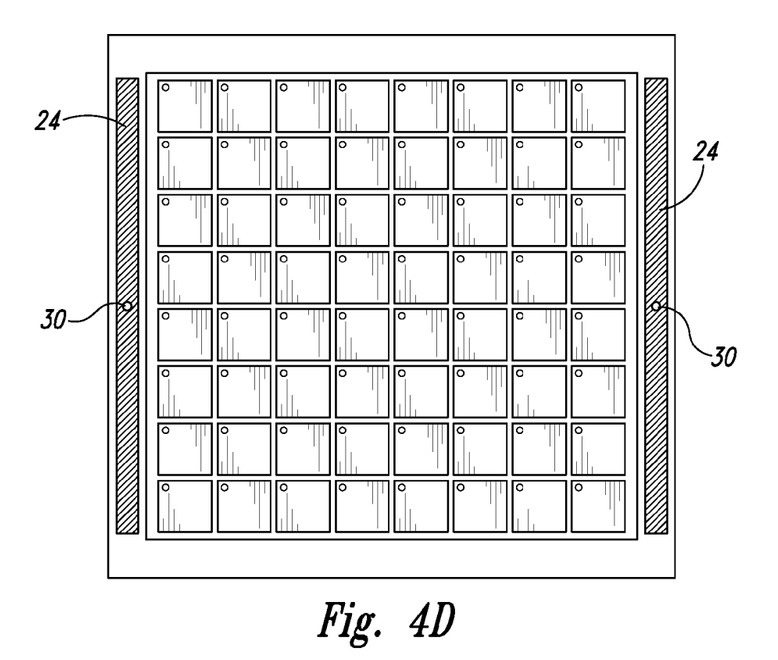
Figure 4E:
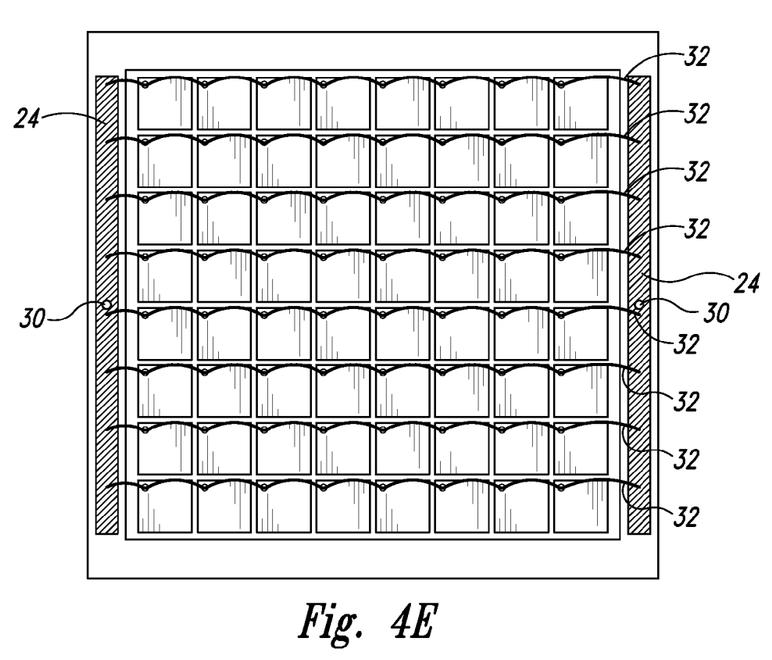
Figure 4F:
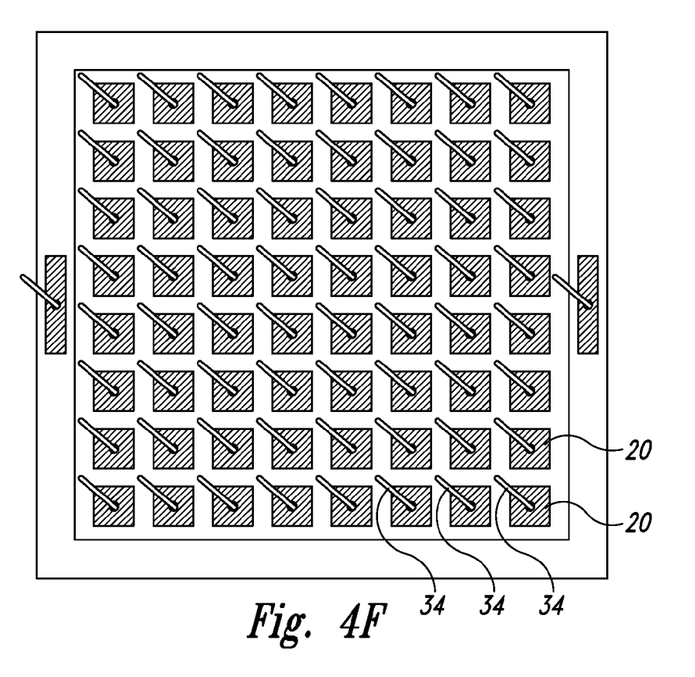

Accordingly, and with reference to FIGS. 1-3, the present invention in one embodiment is directed to an avalanche photo-detector array 10. As shown, the avalanche photo-detector array 10 comprises a dielectric structure 12 formed on a semiconductor substrate 14. A matrix of front side conductive areas 16 are formed and positioned on a front side of the substrate 18 such that each front side conductive area 16 is separated from each other front side conductive area 16. As best shown in FIG. 3, a matrix of corresponding front side photo-detector (photodiode) elements 28 are positioned on the matrix of front side conductive areas 16 such that each front side photodetector element 28 is separated from each other front side photo-detector element 28. As best shown in FIG. 2, a confronting matrix of back side conductive areas 20 are similarly formed and positioned on a back side of the substrate 18 opposite from the matrix of front side conductive areas 16. As shown, each back side conductive area 20 is separated from each other back side conductive area 20, and each back side conductive area 20 is electrically connected to each corresponding front side conductive area 16 by way of at least one interconnecting conductive area through-hole 22. The back side conductive areas 20 are used as individual signal out (electrodes) for the photo-detector elements 28.

The avalanche photo-detector array 10 of the present invention also comprises (1) at least one front side conductive strip 24 positioned on the front side of the substrate 18 and adjacent to the matrix of front side conductive areas 16, and (2) at least one back side conductive strip 26 positioned on the back side of the substrate 18 and adjacent to the matrix of back side conductive areas 20. As shown, the at least one back side conductive strip 26 is electrically connected to the at least one front side conductive strip 24 by way of an interconnecting through-hole 30. The back side conductive strip(s) 26 is (are) used as a common electrode for the photo-detector elements 28 (photodiodes). This serves to supply common bias voltage to all photo-detector elements 28 of the photo-detector array. In addition, the at least one front side conductive strip 24 and each front side conductive area 16 are electrically interconnected to one another by a plurality of wires The photo-detector elements 28 (photodiodes) are installed on the corresponding front side conductive areas 16 of the dielectric structure 12 so as to connect electrically the back side conductive areas 20 to the corresponding face conductive areas 16 using, for example, a conductive glue. The face conductive areas 16 are connected to each other with a metal wire 32 using wire bonding technology. The face electrodes of photo-diodes are also connected with the face conductive strips using wire bonding technology. In this manner, the face electrodes of all photodiodes are connected to the common conductive strip of the array and their back electrodes are connected to its individual pins 34 on the back side of the dielectric structure.

While the present invention has been described in the context of the embodiments illustrated and described herein, the invention may be embodied in other specific ways or in other specific forms without departing from its spirit or essential characteristics. Therefore, the described embodiments are to be considered in all respects as illustrative and not restrictive. The scope of the invention is, therefore, indicated by the appended claims rather than by the foregoing description, and all changes that come within the meaning and range of equivalency of the claims are to be embraced within their scope.

What is claimed is:

1. An avalanche photodetector array, comprising:
   a dielectric structure formed on a substrate;
   a matrix of front side conductive areas positioned on a front side of the substrate, wherein each front side conductive area is separated from each other front side conductive area;
   a matrix of corresponding physically discrete front side photo-detector elements coupled to the matrix of front side conductive areas via a conductive adhesive, wherein each front side photo-detector element is separated from each other front side photo-detector element without being disposed in and surrounded by a conjoining material and each photo-detector element forming an overhang defined by an open space between the photo-detector element and the substrate, with the front side conductive area disposed between the photo-detector element and the substrate and abutting the open space between photo-detector element and the substrate;
   a confronting matrix of back side conductive areas positioned on a back side of the substrate opposite from the matrix of front side conductive areas, wherein each back side conductive area is separated from each other back side conductive area, and wherein each back side conductive area is electrically connected to each corresponding front side conductive area by way of at least one interconnecting conductive area through-hole;

at least one front side conductive strip positioned on the front side of the substrate and adjacent to the matrix of front side conductive areas; and at least one back side conductive strip positioned on the back side of the substrate and adjacent to the matrix of back side conductive areas, wherein the at least one back side conductive strip is electrically connected to the at least one front side conductive strip, and wherein the at least one front side conductive strip and each front side conductive area are electrically interconnected to one another.

2. The avalanche photodetector array of claim 1, wherein the front side conductive areas are disposed directly on a front face of the substrate.

3. The avalanche photodetector array of claim 2, wherein the front side conductive areas are respectively disposed directly between the front face of the substrate and respective photo-detector elements.

4. The avalanche photodetector array of claim 3, wherein the photo-detector elements extend over the edges of respective front side conductive areas.

5. The avalanche photodetector array of claim 1, wherein each respective front side conductive area and back side conductive area are interconnected by only one conductive area through-hole that defines a cavity that extends contiguously between the front side conductive area and back side conductive area.

6. The avalanche photodetector array of claim 1, wherein each photo-detector element is associated with only one respective conductive area through-hole.

7. The avalanche photodetector array of claim 1, wherein the substrate defines a plurality of sidewalls extending from the front side of the substrate, the sidewalls and front side of the substrate defining a concave tray and the sidewalls defining peripheral edges of the avalanche photodetector array and at least a portion of an exposed front face of the avalanche photodetector array.

8. The avalanche photodetector array of claim 7, wherein the photo-detector elements are disposed within the concave tray.

9. The avalanche photodetector array of claim 7, wherein a top of the sidewalls extends a height greater than a face of each of the photo-detector elements.

10. The avalanche photodetector array of claim 7, comprising a pair of front side conductive strips respectively disposed on and extending along opposing sidewalls.

11. The avalanche photodetector array of claim 1, wherein the matrix of corresponding front side photo-detector elements defines a plurality of rows and columns.

12. The avalanche photodetector array of claim 11, wherein each photo-detector element of a given row is directly connected to at least one neighbor photo-detector element via a metal wire, without the metal wire being disposed in and surrounded by a conjoining material.

13. The avalanche photodetector array of claim 11, comprising a pair of front side conductive strips respectively disposed facing ends of the rows, with each conductive strip directly connected to each facing end of each row via a respective metal wire, without the metal wire being disposed in and surrounded by a conjoining material.

14. The avalanche photodetector array of claim 11, wherein each respective photo-detector element is electrically connected via an elongated pin that extends linearly through a respective linear conductive area through-hole and extends from the back side, and perpendicularly to a face of the back side of the substrate directly below each respective photo-detector element.

15. An avalanche photodetector array, comprising:

a dielectric structure formed on a substrate wherein the substrate defines a plurality of sidewalls extending from a front side of the substrate, the sidewalls and front side of the substrate defining a concave tray and the sidewalls defining peripheral edges of the avalanche photodetector array;

a matrix of front side conductive areas positioned in a plurality of rows and columns on the front side of the substrate, wherein each front side conductive area is separated from each other front side conductive area;

a matrix of corresponding physically discrete front side photo-detector elements positioned on the matrix of front side conductive areas, wherein each front side photo-detector element is separated from each other front side photo-detector element without being disposed in and surrounded by a conjoining material, with each photo-detector element of a given row being directly connected to at least one neighbor photo-detector element via a metal wire;

a confronting matrix of back side conductive areas positioned on a back side of the substrate opposite from the matrix of front side conductive areas, wherein each back side conductive area is separated from each other back side conductive area, and wherein each back side conductive area is electrically connected to each corresponding front side conductive area by way of at least one interconnecting conductive area through-hole;

at least one front side conductive strip positioned on the front side of the substrate and adjacent to the matrix of front side conductive areas; and at least one back side conductive strip positioned on the back side of the substrate and adjacent to the matrix of back side conductive areas, wherein the at least one back side conductive strip is electrically connected to the at least one front side conductive strip, and wherein the at least one front side conductive strip and each front side conductive area are electrically interconnected to one another, wherein each respective photo-detector element is electrically connected via an elongated pin that extends linearly through a respective linear conductive area through-hole and extends from the back side, and perpendicularly to a face of the back side of the substrate directly below each respective photo-detector element and coupling to each respective photo-detector element at an underside of the photo-detector element.

16. An avalanche photodetector array, comprising:

a dielectric structure formed on a substrate;

a matrix of front side conductive areas positioned on a front side of the substrate, wherein each front side conductive area is separated from each other front side conductive area;

a matrix of corresponding physically discrete front side photo-detector elements positioned on the matrix of front side conductive areas, wherein each front side photo-detector element is separated from each other front side photo-detector element without being disposed in and surrounded by a conjoining material;

a confronting matrix of back side conductive areas positioned on a back side of the substrate opposite from the matrix of front side conductive areas, wherein each back side conductive area is separated from each other back side conductive area, and wherein each back side conductive area is electrically connected to each corresponding front side conductive area by way of at least one interconnecting conductive area through-hole;

at least one front side conductive strip positioned on the front side of the substrate and adjacent to the matrix of front side conductive areas; and at least one back side conductive strip positioned on the back side of the substrate and adjacent to the matrix of back side conductive areas, wherein the at least one back side conductive strip is electrically connected to the at least one front side conductive strip, and wherein the at least one front side conductive strip and each front side conductive area are electrically interconnected to one another, wherein the substrate defines a plurality of sidewalls extending from the front side of the substrate, the sidewalls and front side of the substrate defining a concave tray and the sidewalls defining peripheral edges of the avalanche photodetector array and at least a portion of an exposed front face of the avalanche photodetector array;

wherein the photo-detector elements are disposed within the concave tray; and wherein a top of the sidewalls extends a height greater than a face of each of the photo-detector elements.

* * * * *